US008056500B2

(12) United States Patent
Tseng et al.

(10) Patent No.: US 8,056,500 B2
(45) Date of Patent: Nov. 15, 2011

(54) THERMAL REACTOR WITH IMPROVED GAS FLOW DISTRIBUTION

(75) Inventors: Ming-Kuei (Michael) Tseng, San Jose, CA (US); Norman Tam, San Jose, CA (US); Yoshitaka Yokota, San Jose, CA (US); Agus Tjandra, San Jose, CA (US); Robert Navasca, Redwood City, CA (US); Mehran Behdjat, San Jose, CA (US); Sundar Ramamurthy, Fremont, CA (US); Kedarnath Sangam, Sunnyvale, CA (US); Alexander N. Lerner, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 242 days.

(21) Appl. No.: 12/339,671

(22) Filed: Dec. 19, 2008

(65) Prior Publication Data
US 2009/0163042 A1      Jun. 25, 2009

Related U.S. Application Data

(60) Provisional application No. 61/015,435, filed on Dec. 20, 2007.

(51) Int. Cl.
B05B 5/00        (2006.01)
(52) U.S. Cl. ........ 118/641; 438/618; 438/648; 438/679; 438/680; 438/681; 438/685; 257/E23.163; 257/E21.593
(58) Field of Classification Search .................. 118/641; 438/618, 648, 679–681, 685; 257/E23.163, 257/E21.593
See application file for complete search history.

(56) References Cited

U.S. PATENT DOCUMENTS

| | | | |
|---|---|---|---|
| 6,534,401 B2 | 3/2003 | Joo et al. | |
| 7,037,560 B1 | 5/2006 | Shinriki et al. | |
| 2001/0042742 A1* | 11/2001 | Li | 219/390 |
| 2005/0011436 A1* | 1/2005 | Liu | 117/204 |
| 2007/0084406 A1 | 4/2007 | Yudovsky et al. | |
| 2007/0087533 A1 | 4/2007 | Nishikawa et al. | |
| 2007/0292614 A1* | 12/2007 | Liu et al. | 427/249.1 |
| 2009/0178611 A1* | 7/2009 | Arena et al. | 117/99 |

FOREIGN PATENT DOCUMENTS
EP      1 132950      9/2001

OTHER PUBLICATIONS
PCT International Search Report and Written Opinion dated Jul. 27, 2009 for International Application No. PCT/US2008/087496. (APPM/011945 PCT).

* cited by examiner

Primary Examiner — Michelle Estrada
(74) Attorney, Agent, or Firm — Patterson & Sheridan, L.L.P.

(57) ABSTRACT

Embodiments of the present invention provide apparatus and method for improving gas distribution during thermal processing. One embodiment of the present invention provides an apparatus for processing a substrate comprising a chamber body defining a processing volume, a substrate support disposed in the processing volume, wherein the substrate support is configured to support and rotate the substrate, a gas inlet assembly coupled to an inlet of the chamber body and configured to provide a first gas flow to the processing volume, and an exhaust assembly coupled to an outlet of the chamber body, wherein the gas inlet assembly and the exhaust assembly are disposed on opposite sides of the chamber body, and the exhaust assembly defines an exhaust volume configured to extend the processing volume.

20 Claims, 7 Drawing Sheets

THERMAL REACTOR WITH IMPROVED GAS FLOW DISTRIBUTION

CROSS-REFERENCE TO RELATED APPLICATION

This patent application Claims Priority to U.S. Provisional Patent Application Ser. No. 61/015,435 filed Dec. 20, 2007, which is incorporated by reference in its entirety.

BACKGROUND OF THE INVENTION

1. Field of the Invention

The present invention relates generally to a semiconductor processing tool and, more specifically, to a thermal reactor with improved gas flow distribution.

2. Description of the Related Art

Rapid thermal processing, commonly referred to as 'RTP', subjects a substrate to a very brief, intense burst of heat that can go from room temperature to about 1000° C. in seconds. RTP technology is used to change the characteristics of a deposited film or crystal lattice. RTP generally includes processes such as annealing, silicidation and oxidation of a substrate surface.

Generally, an RTP chamber includes a radiant heat source or lamp, a chamber body, a substrate support ring, and a process gas supplying system. The radiant heat source is typically mounted on a top surface of the chamber body so that the energy generated by the heat source radiates upon the substrate supported by the substrate support ring within the chamber body. A quartz window is typically disposed in the top surface of the chamber body to facilitate energy transferring from the heat source to the substrate. An external motor is usually used to rotate the support ring and the substrate to compensate for variations in the radiation energy generated by the lamp that could heat the substrate non-uniformly. A rapid thermal process may be performed at a reduced pressure to get better uniformity.

Processing gases, for example oxygen source in an oxidation process, are usually supplied to the chamber from a gas inlet, and are kept flowing in the chamber by a pumping system connected to chamber. Gas distribution in a conventional chamber is not uniform across the chamber. For example, gas distribution near the gas inlet is different from gas distribution near the pumping port, and gas distribution near the edge region is different from gas distribution near the center region. Although, continuous rotation of the substrate may reduce the non-uniformity of gas distribution, the rotation alone may not be enough as the requirement for uniformity increases.

Therefore, there is a need for a thermal reactor with improved gas flow distribution.

SUMMARY OF THE INVENTION

The present invention provides methods and apparatus for performing a thermal process. More particularly, embodiments of the present invention provide apparatus and method for improving gas distribution during thermal processing.

One embodiment of the present invention provides an apparatus for processing a substrate comprising a chamber body defining a processing volume, a substrate support disposed in the processing volume, wherein the substrate support is configured to support and rotate the substrate, a gas inlet assembly coupled to an inlet of the chamber body and configured to provide a first gas flow to the processing volume, and an exhaust assembly coupled to an outlet of the chamber body, wherein the gas inlet assembly and the exhaust assembly are disposed on opposite sides of the chamber body, and the exhaust assembly defines an exhaust volume configured to extend the processing volume.

Another embodiment of the present invention provides an apparatus for thermal processing a substrate comprising a base ring having sidewalls defining a cylindrical center volume, wherein the base ring has an inlet port and an outlet port formed through the sidewalls, the inlet port and the outlet port are formed on opposite sides, and each of the inlet port and the outlet port has a width that approximates a diameter of the cylindrical center volume, a top wall coupled to the base ring to seal the cylindrical center volume from an upper end of the sidewalls, a heat source disposed above the top wall and configured to provide thermal energy to the cylindrical center volume, a bottom wall coupled to the base ring to seal the cylindrical center volume from a lower end of the sidewalls, a substrate support disposed in the cylindrical center volume, wherein the substrate support is configured to support and rotate the substrate, an injection cartridge coupled to the base ring in the inlet port, wherein the injection cartridge is configured to provide a first gas flow to the cylindrical center volume, and an exhaust assembly coupled to the outlet port of the base ring, wherein the exhaust assembly is configured to pull the first gas flow from the inlet port to the outlet port.

Yet another embodiment of the present invention provides a method for processing a substrate comprising providing a process chamber defining a processing volume, wherein the process chamber has an inlet port and an exhaust port formed on opposite sides of the process chamber, and widths of the inlet port and outlet port approximate a diameter of the substrate, positioning the substrate in a processing volume, providing a first gas flow from the inlet port to the outlet port, wherein the first gas flow are directed from a plurality of injection holes evenly distributed along the width of the inlet port, and pumping the processing volume using an exhaust assembly coupled to the outlet port, wherein the exhaust assembly defines an exhaust volume that extends the processing volume along the direction of the first gas flow.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention provides methods and apparatus for thermally processing semiconductor substrates. Thermal processing chambers of the present invention comprise an exhaust assembly configured to extend a processing volume along a direction of a gas flow to improve gas distribution uniformity. Embodiments of the present invention further comprise a side injection assembly configured to provide a side flow to improve edge processing. Additionally, thermal processing chambers of the present invention comprise an injection cartridge having two or more input to improve flow uniformity across a length of an injection port.

Figure 1:
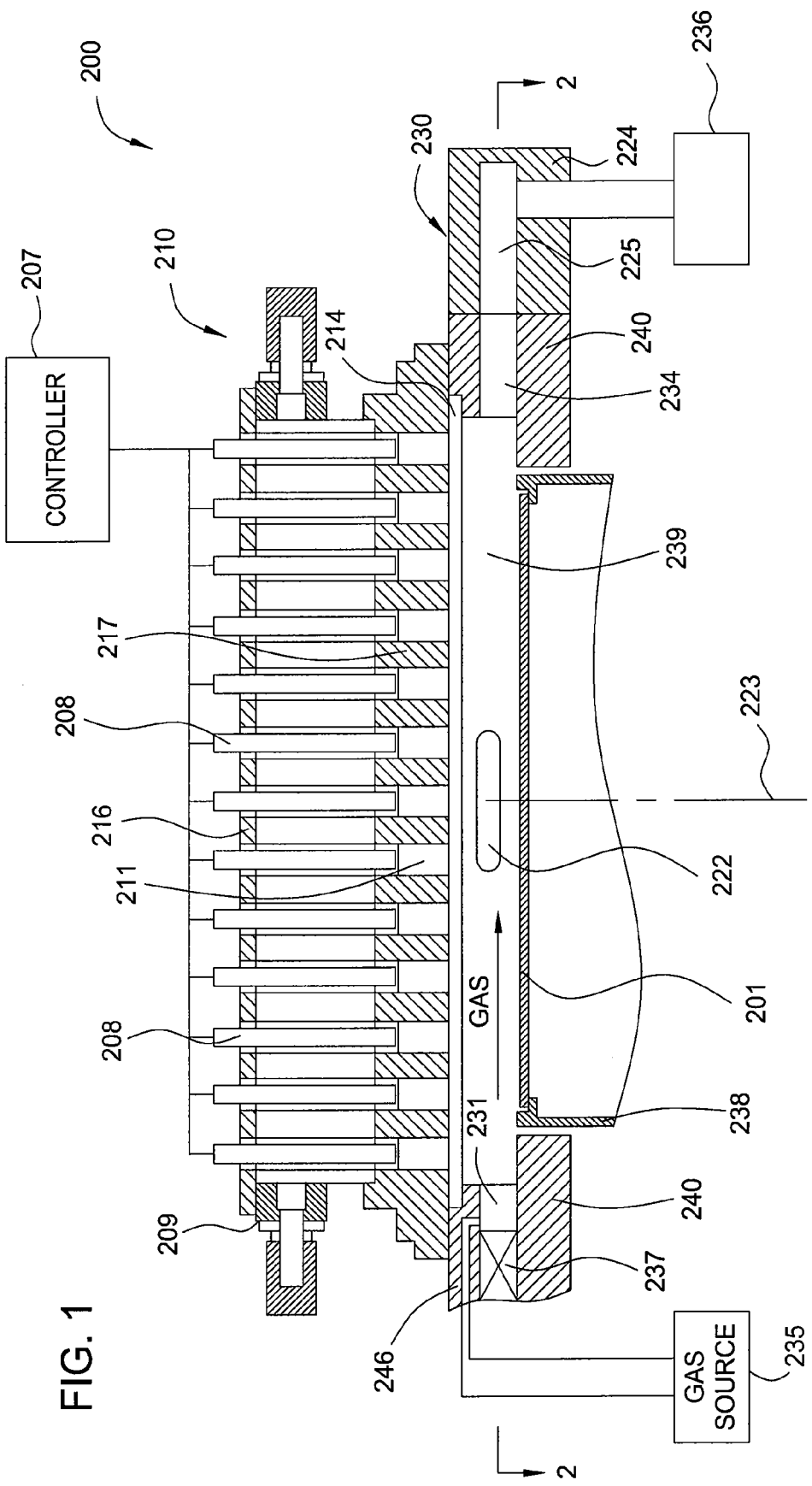
FIG. 1 is a schematic sectional side view of a thermal reactor in accordance with one embodiment of the present invention.

FIG. 1 is a schematic sectional side view of a thermal processing chamber 200 in accordance with one embodiment of the present invention.

The thermal processing chamber 200 generally comprises a lamp assembly 210, a chamber assembly 230 defining a processing volume 239, and a substrate support 238 disposed in the processing volume 239.

The lamp assembly 210 is positioned above the chamber assembly 230 and is configured to supply heat to the processing volume 239 via a quartz window 214 disposed on the chamber assembly 230. The lamp assembly 210 is configured to house a heating source, such as a plurality of tungsten-halogen lamps for providing a tailored infrared heating means to a substrate 201 disposed on the substrate support 238.

The lamp assembly 210 generally comprises a plurality of light pipes 211. The light pipes 211 may be made of stainless steel, brass, aluminum or other metal. Each of the light pipes 211 is configured to house a radiant energy source 208, for example a tungsten-halogen lamp to provide heat to the processing volume 239 in form of infrared radiation. The ends of the light pipes 211 are brazed or welded to openings in an upper cooling wall 216 and a lower cooling wall 217.

In one embodiment, the light pipes 211 may be disposed in a hexagonal arrangement. Coolant may be circulated to the lamp assembly 210 through an inlet 209 to keep the lamp assembly 210 cool during processing. Each of the radiant energy source 208 may be connected to a controller 207 which may control the energy level of each radiant energy source 208 to achieve a uniform or tailored heating profile to the processing volume 239.

The chamber assembly 230 generally comprises a base ring 240 defining the processing volume 239 with the quartz window 214 and a bottom wall (not shown).

The base ring 240 may have an inlet 231 adapted to a gas source 235 configured to provide one or more processing gases to the processing volume 239. An outlet 234, formed on an opposite side of the base ring 240 from the inlet 231, is adapted to an exhaust assembly 224 which is in fluid communication with a pump system 236. The exhaust assembly 224 defines an exhaust volume 225, which is in fluid communication with the processing volume 239 via the outlet 234.

The exhaust volume 225 is designed to allow uniform gas flow distribution across the processing volume 239.

A silt valve 237 may be adapted to the inlet 231 of the base ring 240 for a robot to drop/retrieve the substrate 201 on/from a substrate support 238 positioned in the processing volume 239. The substrate support 238 may be configured to move vertically and to rotate about a central axis 223.

In one embodiment, the base ring 240 may have one or more side ports 222 formed on sides of the base ring 240 between the inlet 231 and the outlet 234. The side openings 222 may be connected to a side gas source configured to improve gas distribution uniformity near edge areas of the substrate 201.

Figure 2:
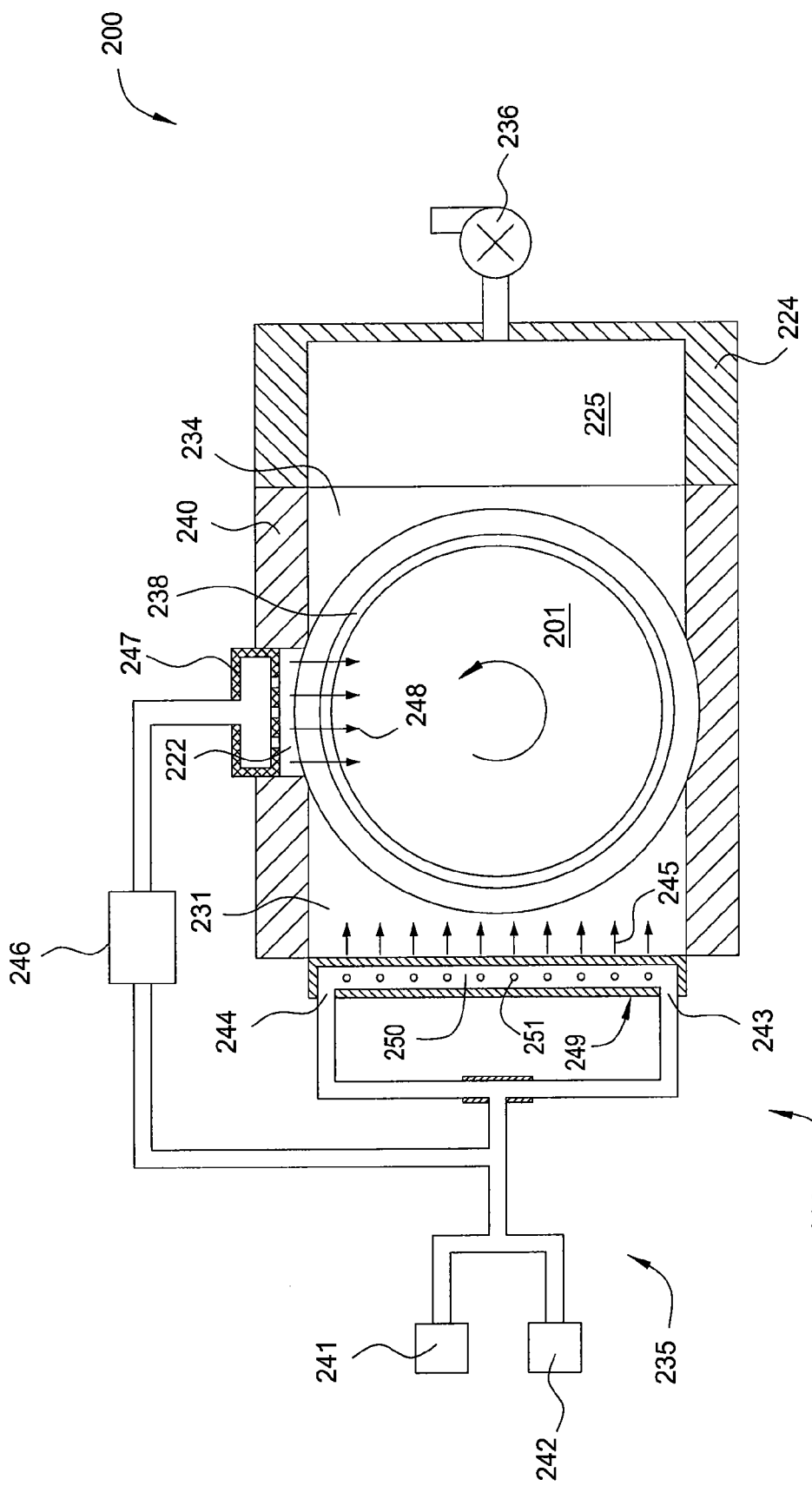
FIG. 2 is a schematic sectional top view of a thermal reactor having a gas distribution system in accordance with one embodiment of the present invention.

FIG. 2 is a schematic sectional top view of the thermal processing chamber 200 showing a gas distribution system in accordance with one embodiment of the present invention.

As shown in FIG. 2, the inlet 231 and outlet 234 are formed through the base ring 240 on opposite sides of the processing volume 239. Both of the inlet 231 and the outlet 234 have a width which approximates a diameter of the substrate support 238.

In one embodiment, the gas source 235 may comprise multiple gas sources, for example a first gas source 241, and a second gas source 242, each configured to provide a processing gas. Processing gases from the first gas source 241 and the second gas source 242 may mix together prior to entering an injection cartridge 249 disposed in the inlet 231.

In one embodiment, the injection cartridge 249 has an elongated channel 250 formed therein and two inlets 243, 244 formed on opposite ends of the elongated channel 250. A plurality of injecting holes 251 are evenly distributed along the elongated channel 250 and are configured to inject a gas flow 245 towards the processing volume 239. The two-inlet design of the cartridge 249 improves uniformity among the gas flow from each of the plurality of injecting holes 251.

Under the vacuum force from the pump system 236, the gas flow 245 is directed from the inlet 231 towards the outlet 234. It is desirable to have the gas flow 245 uniform across the processing volume 239 from the inlet 231 to the outlet 234. In one embodiment, the exhaust volume 225 of the exhaust assembly 224 is configured to extend the processing volume 239 to reduce the geometry influence of the chamber structure to the gas flow 245. Particularly, the exhaust volume 225 is configured to extend the processing volume 239 along the direction of the gas flow 245.

In one embodiment, a side injection assembly 247 is coupled to the base ring 240 so that a side gas flow 248 is provided to the processing volume 239 via the side port 222. The side injection assembly 247 is coupled to the gas source 235 via a flow adjusting device 246 configured to control a flow rate of the side gas flow 248. The side port 222 is generally formed through the base ring 240 between the inlet 231 and the outlet 234.

The side gas flow 248 is configured to adjust edge profile of the substrate 201 being processed. In one embodiment, the side gas flow 248 increases gas exposure of the substrate 201 near the edge area. In one embodiment, the side gas flow 248 may be directed at a direction substantially perpendicular to the gas flow 245. In one embodiment, the effect of the side gas flow 248 on the edge may be adjusted by adjusting a flow rate of the side gas flow 248.

As discussed above, the substrate 201 typically rotates about its center during process. The substrate 201 may be rotated along either counter clockwise or clockwise direction. The rotation of the substrate 201 may drag the side gas flow 248 away from the outlet 234 so that the side gas flow 248 may have increased effect on the substrate 201.

Figure 3:
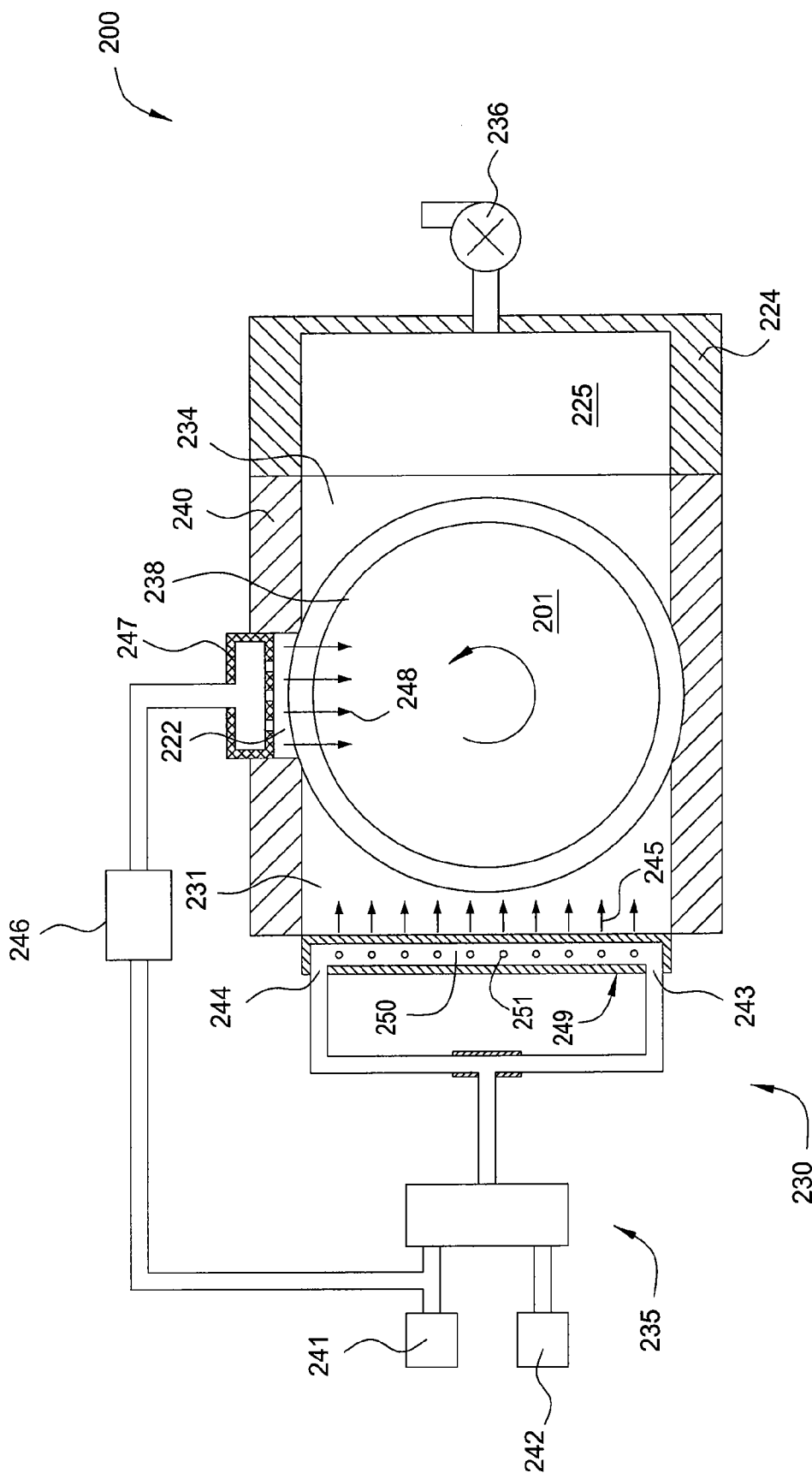
FIG. 3 is a schematic sectional top view of a thermal reactor having a gas distribution system in accordance with another embodiment of the present invention.

In one embodiment, the side gas flow 248 may come from the mixed gas source and comprise the same gas components as the gas flow 245, as shown in FIG. 2. In another embodiment, the side gas flow 248 may comprise only part of the gas components in the gas flow 245, or comprise different gas components from the gas flow 245. FIG. 3 is a schematic sectional top view of the thermal processing chamber 200 having a gas distribution system which provides only one processing gas component through the side gas flow 248.

Even though, FIGS. 2-3 show the substrate 201 is rotating along counter clockwise direction, the substrate 201 may be rotated along clockwise direction and also benefit from the side gas flow 248.

Figure 4:
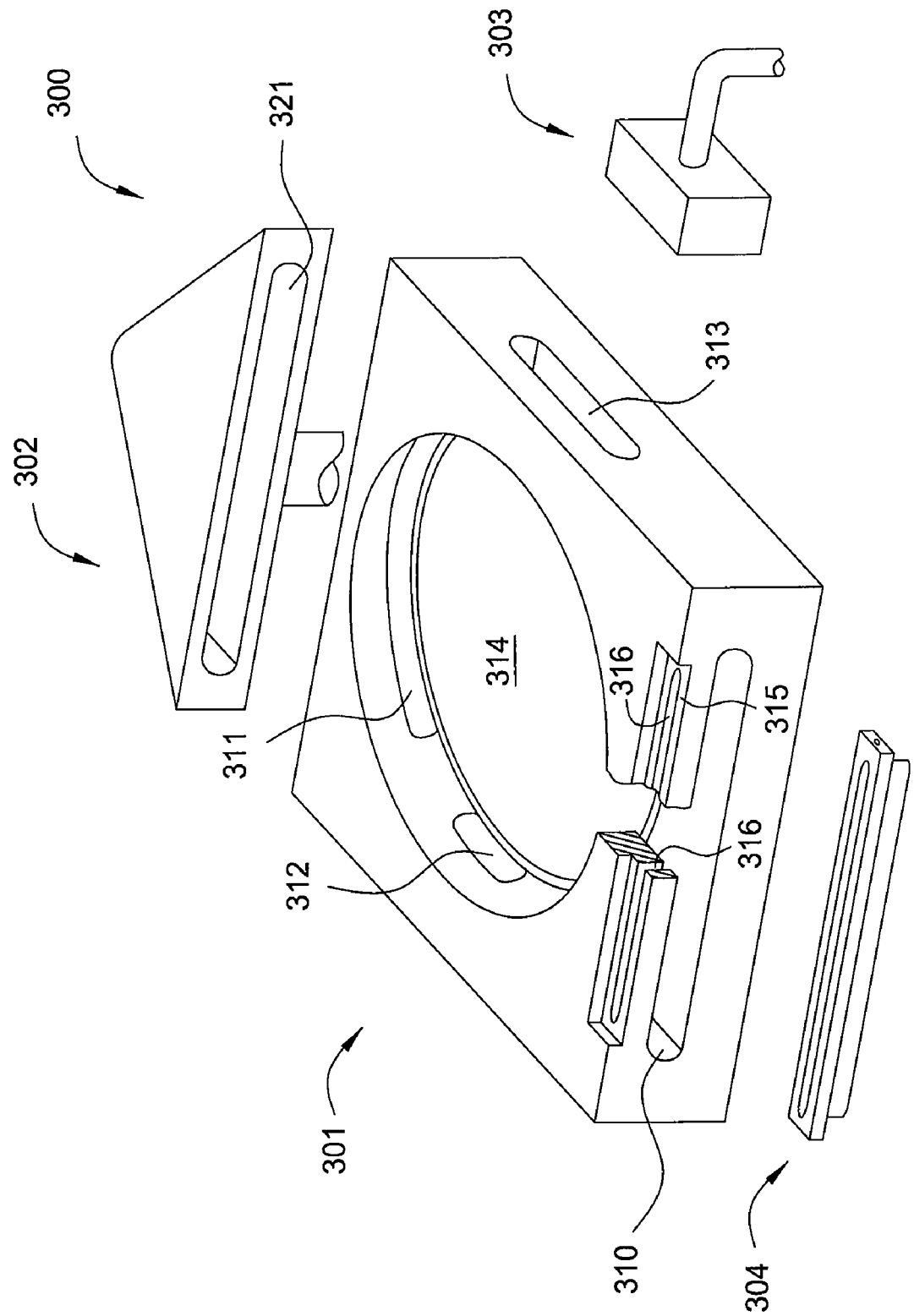
FIG. 4 is a schematic exploded view of a base ring of a thermal reactor in accordance with one embodiment of the present invention.

FIG. 4 is a schematic exploded view of a base ring assembly 300 for providing a uniform gas flow in accordance with one embodiment of the present invention.

The base ring assembly 300 comprises a base ring 301 defining a cylindrical processing volume 314 configured to process a substrate therein. The base ring 301 has an inlet port 310 and an outlet port 311 formed at opposite sides of the cylindrical processing volume 314. In one embodiment, widths of the inlet port 310 and the outlet port 311 are substantially similar to a diameter of the cylindrical processing volume 314 to assure uniform gas flow from the inlet port 310 to the outlet port 311.

The base ring assembly 300 further comprises an injection cartridge 304 connected with the inlet port 310. The injection cartridge 304 is configured to provide a gas flow from the inlet port 310 to the outlet port 311. A notch 315 is formed on the base ring 301 above the input port 310 and an elongated throw hole 316 is formed on a bottom of the notch 315 and open to the input port 310. The cartridge 304 is configured to provide processing gases through the elongated throw hole 316 to the input port 310 and the cylindrical processing volume 314. During processing, the input port 310 is typically used to allow passage of substrates being processed.

Figure 5:
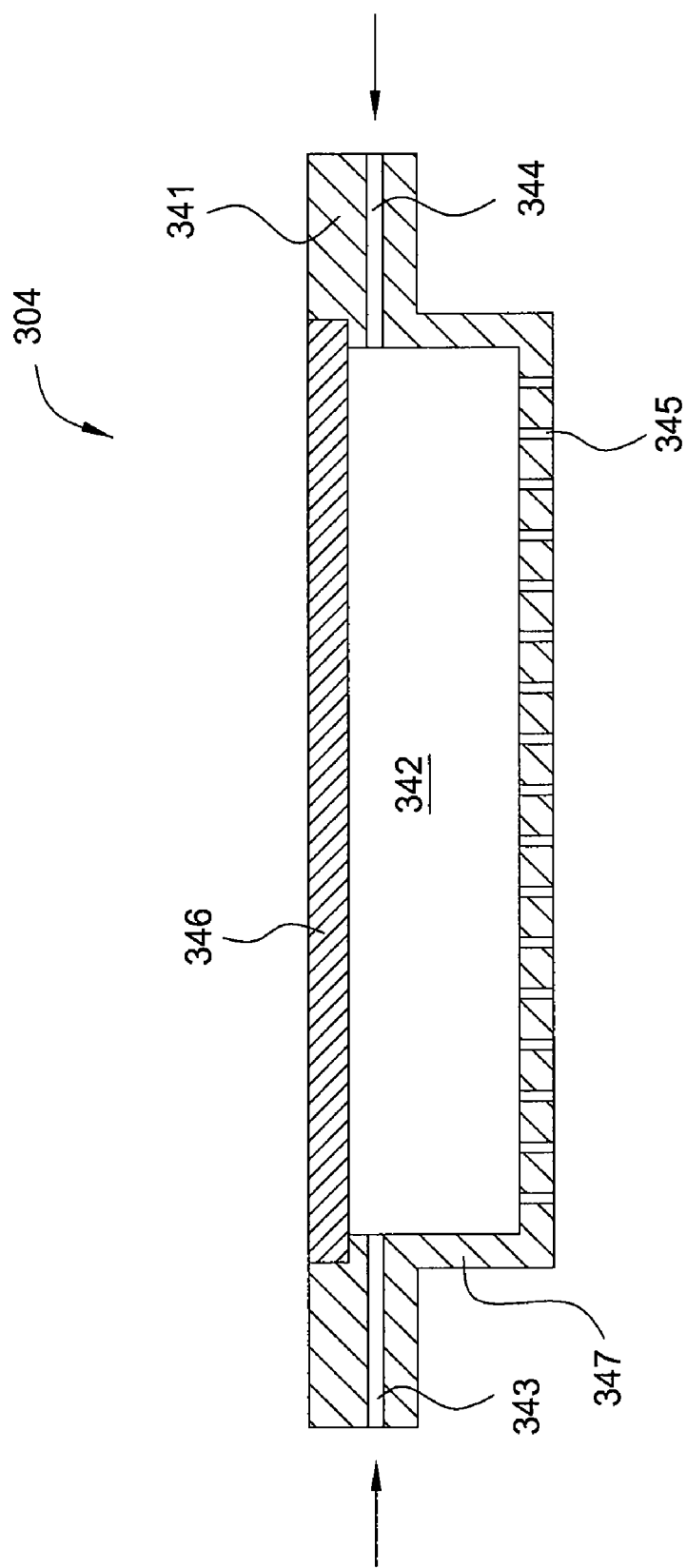
FIG. 5 is a schematic sectional side view of an injection cartridge in accordance with one embodiment of the present invention.

FIG. 5 is a schematic sectional side view of the injection cartridge 304 in accordance with one embodiment of the present invention. The injection cartridge 304 has an elongated body 347 with a flange 341. The flange 341 allows the injection cartridge 304 to be inserted into the elongated through hole 316. A lid 346 is coupled to the elongated body 347 to seal the elongated channel 342.

The elongated body 347 has an elongated channel 342 formed therein. Inlets 343, 344 are formed through both ends of the elongated body 347 to the elongated channel 342. The inlets 343, 344 are configured to connect with a gas source. A plurality of ports 345 are formed on a bottom of the elongated body 347 to connect the elongated channel 342 with outside volume.

During processing, a process gas comes from both of the inlets 343, 344, fills up the elongated channel 342 and exits the injection cartridge 304 from the plurality of ports 345 to the input port 310 of the base ring 301.

An exhaust assembly 302 is coupled to the base ring 301 near the outlet port 311. The exhaust assembly 302 has an opening 321 substantially similar to the outlet port 311 providing extra volume to allow uniform gas flow in the cylindrical processing volume 314.

Figure 6:
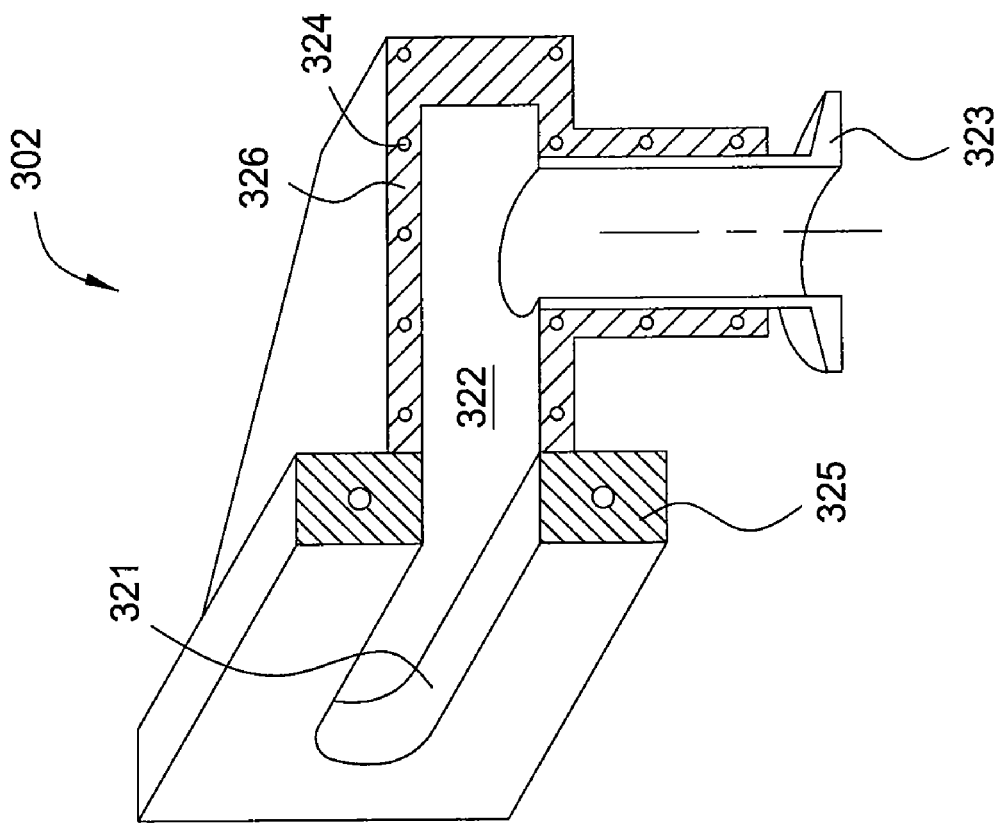
FIG. 6 is a schematic perspective sectional view of an exhaust assembly in accordance with one embodiment of the present invention.

FIG. 6 is a schematic perspective sectional view of the exhaust assembly 302 in accordance with one embodiment of the present invention. The exhaust assembly 302 comprises a flange 325 configured to connect to the base ring 301, a body 326 defining an exhaust volume 322, and an exhaust 323 configured to connect with a pumping system. A plurality of cooling channels 324 are formed in the exhaust assembly 302 and configured to control temperature of the exhaust assembly 302 using cooling or heating fluid.

The exhaust volume 322 of the exhaust assembly 302 is configured to extend the cylindrical processing volume 314 of the base ring 301 along the direction from the inlet port 310 to the outlet port 314. In one embodiment, the exhaust volume 322 may have a tapered shape with one wide end connecting to the opening 321 and one narrow end connecting to the exhaust 323. The tapered shape allows gradual gathering of a gas flow spread across the width of the opening 321 to narrow entrance of the exhaust 323, thus minimizing turbulence to the gas flow in the cylindrical processing volume 314. A triangle shaped exhaust volume 322 is illustrated in FIGS. 4 and 6, however, any shape that reduces turbulence to the gas flow is contemplated.

The base ring assembly 300 further comprises one or two side injection assemblies 303 coupled to side ports 313 or 312 formed on through the base ring 301. The side ports 312, 313 are formed between the inlet port 310 and the outlet port 311 and are configured to allow a side gas flow to the cylindrical processing volume 314. As previously discussed, the side gas flow is configured to tune edge processing profile.

Figure 7:
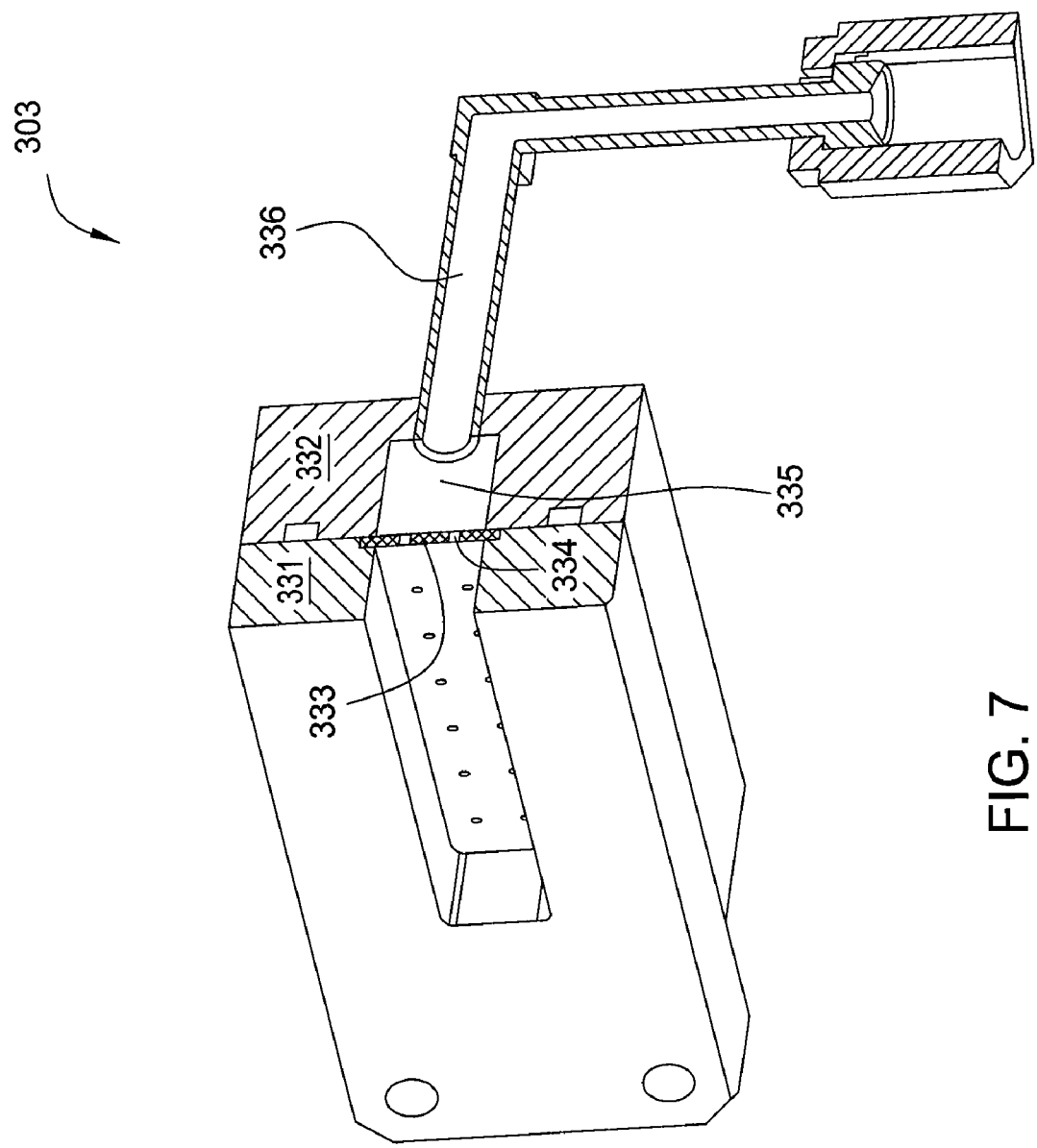
FIG. 7 is a schematic perspective sectional view of a side injection assembly in accordance with one embodiment of the present invention.

FIG. 7 is a schematic perspective sectional view of the side injection assembly 303 in accordance with one embodiment of the present invention. The side injection assembly 303 comprises a face plate 331 configured to connect with the base ring 301, a body 332 defining a gas chamber 335, a diffuser plate 333 sandwiched between the body 332 and the face plate 331, and an inlet 336 configured to connect the gas chamber 335 with a gas source. The diffuser plate 333 has a plurality of through holes 334 configured to provide a gas flow from the gas chamber 335 to the cylindrical processing volume 314 of the base ring 301. In one embodiment, the diffuser plate 333 may be formed from ceramic.

Even though a thermal processing chamber is discussed in this application, embodiments of the present invention may be used in any processing chamber where uniform gas flow is desired.

While the foregoing is directed to embodiments of the present invention, other and further embodiments of the invention may be devised without departing from the basic scope thereof, and the scope thereof is determined by the claims that follow.

What is claimed is:

1. An apparatus for processing a substrate, comprising:
a chamber body defining a processing volume;
a substrate support disposed in the processing volume, wherein the substrate support is configured to support and rotate the substrate;
a gas inlet assembly coupled to an inlet of the chamber body and configured to provide a first gas flow to the processing volume, wherein the gas inlet assembly comprises a cartridge disposed in the inlet, the cartridge having two input ports configured to connect with a gas source, and a plurality of injection ports evenly distributed across a width of the cartridge; and
an exhaust assembly coupled to an outlet of the chamber body, wherein the gas inlet assembly and the exhaust assembly are disposed on opposite sides of the chamber body, and the exhaust assembly defines an exhaust volume configured to extend the processing volume, wherein both the inlet and outlet of the chamber body have a width approximate a diameter of the substrate support.

2. An apparatus for processing a substrate, comprising:
a chamber body defining a processing volume;

a substrate support disposed in the processing volume, wherein the substrate support is configured to support and rotate the substrate;

a gas inlet assembly coupled to an inlet of the chamber body and configured to provide a first gas flow to the processing volume; and an exhaust assembly coupled to an outlet of the chamber body, wherein the gas inlet assembly and the exhaust assembly are disposed on opposite sides of the chamber body, the exhaust assembly defines an exhaust volume configured to extend the processing volume, wherein both the inlet and outlet of the chamber body have a width approximate a diameter of the substrate support, and the exhaust volume extends the processing volume along a direction of the first gas flow.

3. The apparatus of claim 2, wherein the exhaust volume has a tapered shape with a wide end coupled to the outlet and a narrow end coupled to a vacuum pump.

4. An apparatus for thermal processing a substrate, comprising:
a base ring having sidewalls defining a cylindrical center volume, wherein the base ring has an inlet port and an outlet port formed through the sidewalls, the inlet port and the outlet port are formed on opposite sides of the base ring, and each of the inlet port and the outlet port has a width that approximates a diameter of the cylindrical center volume;
a quartz window coupled to the base ring to seal the cylindrical center volume;
a heat source disposed outside the cylindrical center volume and configured to provide thermal energy to the cylindrical center volume via the quartz window;
a substrate support disposed in the cylindrical center volume, wherein the substrate support is configured to support and rotate the substrate;
an injection cartridge coupled to the base ring in the inlet port, wherein the injection cartridge is configured to provide a first gas flow to the cylindrical center volume; and
an exhaust assembly coupled to the outlet port of the base ring, wherein the exhaust assembly is configured to pull the first gas flow from the inlet port to the outlet port over the substrate support.

5. The apparatus of claim 4, further comprising a side injection assembly coupled to a side port of the base ring, wherein the side injection assembly is configured to provide a second gas flow to the cylindrical center volume.

6. The apparatus of claim 5, further comprising a flow rate controller coupled to the side injection assembly.

7. The apparatus of claim 4, wherein the exhaust assembly defines an exhaust volume which extends the cylindrical center volume along the direction from the inlet port to the outlet port.

8. The apparatus of claim 7, wherein the exhaust volume has a tapered shape with a first opening at one wide end and a second opening at one narrow end, and the first opening connects to the outlet port.

9. The apparatus of claim 4, further comprising a slit valve coupled to the inlet port.

10. An apparatus for processing a substrate, comprising:
a chamber body defining a processing volume;
a substrate support disposed in the processing volume, wherein the substrate support is configured to support and rotate the substrate;
a gas inlet assembly coupled to an inlet of the chamber body and configured to provide a first gas flow to the processing volume;
an exhaust assembly coupled to an outlet of the chamber body, wherein the gas inlet assembly and the exhaust assembly are disposed on opposite sides of the chamber body, and the exhaust assembly defines an exhaust volume configured to extend the processing volume;
a side injection assembly coupled to a side port of the chamber body, wherein the side port is formed through a sidewall of the chamber body between the inlet and the outlet, and the side injection assembly supplies a second gas flow to the processing volume to increase gas exposure of the substrate near an edge region; and
a flow adjusting device connected to the side injection assembly and configured to adjust a flow rate of the second gas flow.

11. An apparatus for processing a substrate, comprising:
a chamber body defining a processing volume;
a substrate support disposed in the processing volume, wherein the substrate support is configured to support and rotate the substrate;
a gas inlet assembly coupled to an inlet of the chamber body and configured to provide a first gas flow to the processing volume;
an exhaust assembly coupled to an outlet of the chamber body, wherein the gas inlet assembly and the exhaust assembly are disposed on opposite sides of the chamber body, and the exhaust assembly defines an exhaust volume configured to extend the processing volume;
a side injection assembly coupled to the chamber body, wherein the side injection assembly is configured to supply a second gas flow to the processing volume, and the side injection assembly comprises a baffle plate having a plurality of injection holes configured to directing a process gas towards the processing volume.

12. An apparatus for thermal processing a substrate, comprising:
a base ring having sidewalls defining a cylindrical center volume, wherein the base ring has an inlet port and an outlet port formed through the sidewalls, and the inlet port and the outlet port are formed on opposite sides of the base ring;
a top wall coupled to the base ring to seal the cylindrical center volume from an upper end of the sidewalls of the base ring;
a heat source disposed above the top wall and configured to provide thermal energy to the cylindrical center volume;
a bottom wall coupled to the base ring to seal the cylindrical center volume from a lower end of the sidewalls of the base ring;
a substrate support disposed in the cylindrical center volume, wherein the substrate support is configured to support and rotate the substrate;
an injection cartridge coupled to the base ring in the inlet port, wherein the injection cartridge is configured to provide a first gas flow to the cylindrical center volume;
an exhaust assembly coupled to the outlet port of the base ring, wherein the exhaust assembly is configured to pull the first gas flow from the inlet port to the outlet port; and
a side injection assembly coupled to a side port of the base ring, wherein the side injection assembly is configured to provide a second gas flow to the cylindrical center volume.

13. The apparatus of claim 12, further comprising a flow rate controller coupled to the side injection assembly.

14. An apparatus for thermal processing a substrate, comprising:
a base ring having sidewalls defining a cylindrical center volume, wherein the base ring has an inlet port and an outlet port formed through the sidewalls, the inlet port and the outlet port are formed on opposite sides of the base ring, and each of the inlet port and the outlet port has a width that approximates a diameter of the cylindrical center volume;

a top wall coupled to the base ring to seal the cylindrical center volume from an upper end of the sidewalls of the base ring;

a heat source disposed above the top wall and configured to provide thermal energy to the cylindrical center volume;

a bottom wall coupled to the base ring to seal the cylindrical center volume from a lower end of the sidewalls of the base ring;

a substrate support disposed in the cylindrical center volume, wherein the substrate support is configured to support and rotate the substrate;

an injection cartridge coupled to the base ring in the inlet port, wherein the injection cartridge is configured to provide a first gas flow to the cylindrical center volume; and an exhaust assembly coupled to the outlet port of the base ring, wherein the exhaust assembly is configured to pull the first gas flow from the inlet port to the outlet port, wherein the exhaust assembly defines an exhaust volume which extends the cylindrical center volume along the direction of the first gas flow.

15. An apparatus for thermal processing a substrate, comprising:

a base ring having sidewalls defining a cylindrical center volume, wherein the base ring has an inlet port, an outlet port and a side port formed through the sidewalls, the inlet port and the outlet port are formed on opposite sides of the base ring, the side port is formed between the inlet port and the outlet port, and each of the inlet port and the outlet port has a width that approximates a diameter of the cylindrical center volume;

a substrate support disposed in the cylindrical center volume, wherein the substrate support is configured to support and rotate the substrate;

an exhaust assembly coupled to the outlet port of the base ring, wherein the exhaust assembly is configured to pull a first gas flow from the inlet port to the outlet port over the substrate support; and a side injection assembly coupled to a side port of the base ring, wherein the side injection assembly is configured to provide a second gas flow to the cylindrical center volume.

16. The apparatus of claim 15, further comprising an injection cartridge coupled to the base ring in the inlet port, wherein the injection cartridge provides the first gas flow to the cylindrical center volume.

17. The apparatus of claim 16, wherein the base ring has two side ports formed through the sidewalls, and a side injection assembly is coupled to each side port.

18. The apparatus of claim 15, further comprising a quartz window coupled to the base ring to seal the cylindrical center volume.

19. The apparatus of claim 15, further comprising a heat source disposed outside the cylindrical center volume to provide thermal energy to the cylindrical center volume via the quartz window.

20. The apparatus of claim 15, wherein the exhaust assembly defines an exhaust volume which extends the cylindrical center volume along the direction from the inlet port to the outlet port.

* * * * *